(12) United States Patent
Mucha

(10) Patent No.: US 10,419,857 B2
(45) Date of Patent: Sep. 17, 2019

(54) SENSOR WITH ENHANCED LINEARITY AND ACOUSTIC OVERLOAD POINT

(71) Applicant: INVENSENSE, INC., San Jose, CA (US)

(72) Inventor: Igor Mucha, Bratislava (SK)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/955,614

(22) Filed: Apr. 17, 2018

(65) Prior Publication Data

US 2019/0166432 A1 May 30, 2019

Related U.S. Application Data

(60) Provisional application No. 62/591,185, filed on Nov. 27, 2017.

(51) Int. Cl.
| | |
|---|---|
| *H04R 19/00* | (2006.01) |
| *H04R 1/04* | (2006.01) |
| *H04R 1/08* | (2006.01) |
| *H04R 19/04* | (2006.01) |

(52) U.S. Cl.
CPC ............. *H04R 19/005* (2013.01); *H04R 1/04* (2013.01); *H04R 1/083* (2013.01); *H04R 19/04* (2013.01); *B81B 2201/0257* (2013.01); *H04R 2201/003* (2013.01)

(58) Field of Classification Search
CPC . H04R 1/04; H04R 1/083; H04R 3/00; H04R 3/02; H04R 3/06; H04R 15/00; H04R 19/02; H04R 19/04; H04R 19/005; H04R 19/2201; H04R 19/003; H04R 2203/45212; H04R 2203/45288; H04R 2410/03; H04R 2430/00; B81B 2201/0257; H03F 3/45475; H03F 2203/45288
USPC .......................... 381/111, 120, 121, 174, 176
See application file for complete search history.

(56) References Cited

U.S. PATENT DOCUMENTS

| | | | | |
|---|---|---|---|---|
| 6,285,769 | B1 * | 9/2001 | Edelson | H04R 3/002 |
| | | | | 381/111 |
| 10,237,650 | B2 * | 3/2019 | Mucha | H04R 3/02 |
| 2015/0208165 | A1 * | 7/2015 | Volk | H04R 3/005 |
| | | | | 381/111 |
| 2017/0318385 | A1 * | 11/2017 | Harney | H02M 3/07 |
| 2018/0167730 | A1 * | 6/2018 | Parker | H04R 19/005 |
| 2018/0234762 | A1 * | 8/2018 | Ganta | H04R 3/02 |

(Continued)

*Primary Examiner* — Binh Kien Tieu
(74) *Attorney, Agent, or Firm* — Amin, Turocy & Watson, LLP

(57) ABSTRACT

Facilitating an enhanced linearity and acoustic overload point of a sensor is presented herein. A system can comprise a first conductive component that is biased at a first direct current (DC) voltage; a second conductive component that is biased at a second DC voltage that is opposite in polarity to the first DC voltage; a third conductive component that is capacitively coupled to the first conductive component and the second conductive component; and a feedback component that generates a non-inverted output signal, comprising a sum of buffered signals generated via capacitive coupling between the third conductive component and the first and second conductive components, generates an inverted output signal comprising an amplified inversion of the non-inverted output signal, and applies the inverted output signal to the third conductive component.

20 Claims, 10 Drawing Sheets

(56) References Cited

U.S. PATENT DOCUMENTS

2018/0234763 A1* 8/2018 Ganta .................... H04R 3/06
2018/0352330 A1* 12/2018 Mucha ................... H04R 3/02
2018/0352337 A1* 12/2018 Klein .................. H04R 19/005

* cited by examiner

SENSOR WITH ENHANCED LINEARITY AND ACOUSTIC OVERLOAD POINT

RELATED APPLICATION

This patent application claims priority to U.S. Provisional Patent Application No. 62/591,185, filed Nov. 27, 2017, and entitled "SENSOR WITH ENHANCED LINEARITY AND ACOUSTIC OVERLOAD POINT," the entirety of which application is hereby incorporated by reference herein.

TECHNICAL FIELD

The subject disclosure generally relates to embodiments for facilitating an enhanced linearity and an enhanced acoustic overload point of a sensor.

BACKGROUND

Conventional microphone technologies can increase an acoustic overload point of a differential silicon microphone by increasing power supplied to such microphone—resulting in excessive supply current and increased die size. In this regard, conventional microphone technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
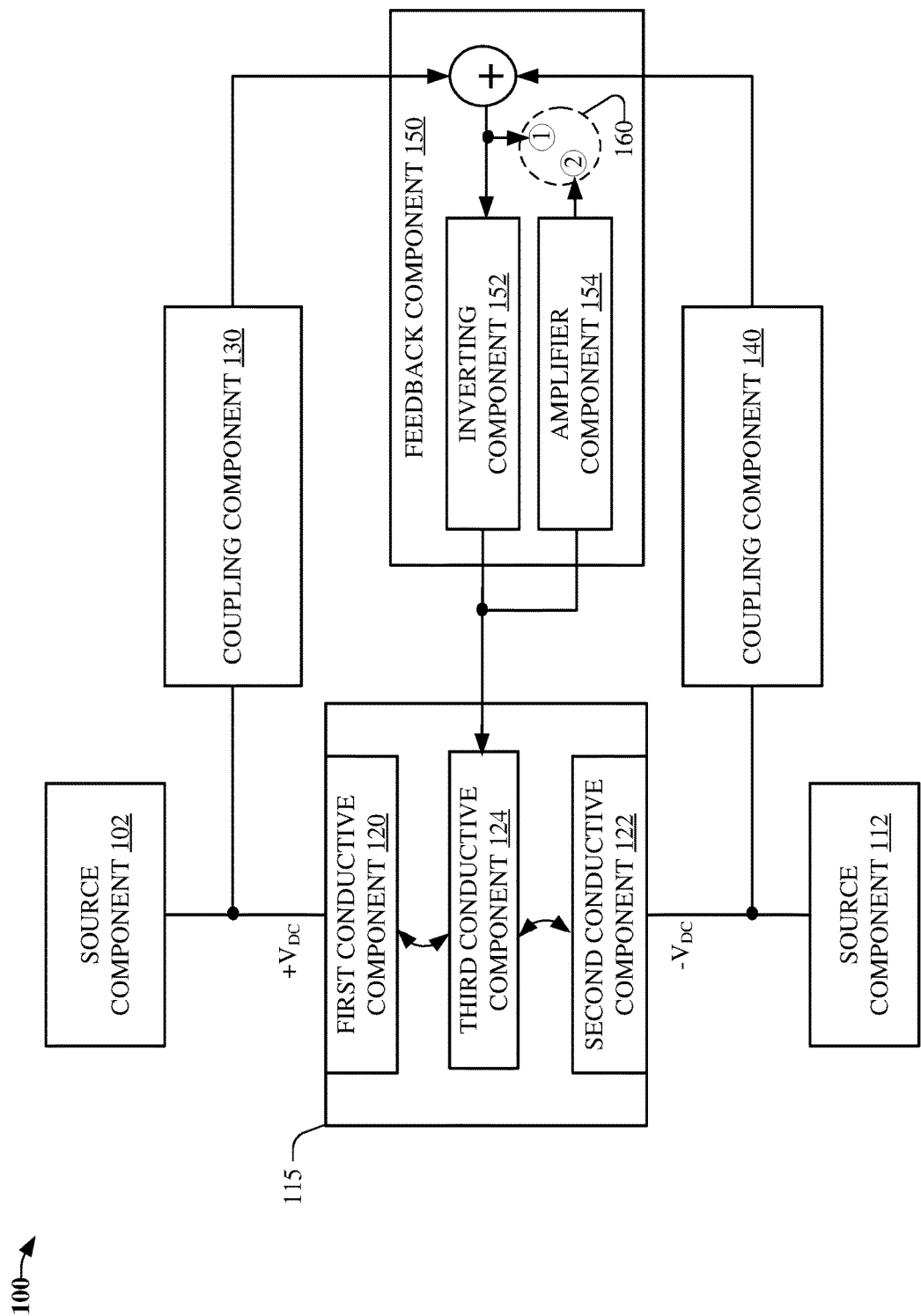
FIG. 1 illustrates a block diagram of negative feedback being applied to an inner conductive component of a dual capacitor sensor device, e.g., MEMS microphone, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventional microphone technologies can generate highly linear acoustic output signals by utilizing a differential, e.g., dual backplate, microphone—obtaining a substantially symmetric output due to reduction of $2^{nd}$ order and other even-order harmonics. With respect to a single-ended, e.g., single backplate, microphone, such technologies can increase an acoustic overload point by using negative feedback—without incurring excessive supply current.

Although conventional technologies have attempted to increase an acoustic overload point of a differential microphone, e.g., by increasing power supplies of respective buffers corresponding to the acoustic output signals, supply currents and power consumption are substantially increased and prohibitive. On the other hand, various embodiments disclosed herein can enhance an acoustic overload point of a dual capacitor sensor, e.g., microphone, comprising two signal electrodes, e.g., dual backplates, dual diaphragms, etc. by biasing such electrodes at voltages of opposite polarity, e.g., allowing for high acoustic overload performance at acceptable supply currents and die area.

For example, a system, e.g., MEMS microphone, can comprise a first conductive component that is biased at a first direct current (DC) voltage; a second conductive component that is biased at a second DC voltage that is opposite in polarity to the first DC voltage; and a third conductive component—the first conductive component generates, based on a first capacitive coupling between the first conductive component and the third conductive component, a first signal corresponding to a first movement of the first conductive component or the third conductive component, and the second conductive component generates, based on a second capacitive coupling between the second conductive component and the third conductive component, a second signal corresponding to a second movement of the second conductive component or the third conductive component.

Further, the system can comprise a feedback component that generates a non-inverted output signal comprising a sum of buffered signals generated by respective coupling components corresponding to the first signal and the second signal, generates an inverted output signal comprising an amplified inversion of the non-inverted output signal, and applies the inverted output signal to the third conductive component—an output, e.g., pseudo differential output, of the system representing the first movement and/or the second movement and comprising the non-inverted output signal and an amplified version of the inverted output signal.

In an embodiment, the first conductive component is a first backplate, the second conductive component is a second backplate, and the third conductive component is a diaphragm comprising a flexible membrane. In another embodiment, the first conductive component is a first diaphragm comprising a first flexible membrane, the second conductive component is a second diaphragm comprising a second flexible membrane, and the third conductive component is a backplate.

In one embodiment, the system further comprises a first source component comprising a first resistive component and a first charge pump that applies, via the first resistive component, a first charge to the first conductive component to generate the first DC voltage; and a second source component comprising a second resistive component and a second charge pump that applies, via the second resistive component, a second charge to the second conductive component to generate the second DC voltage that is opposite in polarity from the first DC voltage.

In yet another embodiment, the system further comprises a first coupling component of the respective coupling components comprising a first resistive component and a first capacitive component that decouples, via the first resistive component, the first conductive component from a ground potential to generate a first capacitively decoupled signal; and a second coupling component comprising a second resistive component and a second capacitive component that decouples, via the second resistive component, the second conductive component from the ground potential to generate a second capacitively decoupled signal.

Further, the first coupling component can comprise a first buffer component that buffers the first capacitively decoupled signal to generate a first buffered signal of the buffered signals, and wherein the second coupling component further comprises a second buffer component that buffers the second capacitively decoupled signal to generate a second buffered signal of the buffered signals. In an embodiment, a gain of the first buffer component is equal to or approximately equal to another gain of the second buffer component.

In one embodiment, the feedback component comprises an inverting component that generates, via an inverting amplifier, the inverted output signal comprising the amplified inversion of the non-inverted output signal; and an amplifier component configured to generate, via a non-inverting amplifier, the amplified version of the inverted output signal. In another embodiment, a gain of the inverting amplifier is greater than one, and another gain of the non-inverting amplifier is equal to, or approximately equal to, two.

In yet another embodiment, a system, e.g., a MEMS microphone, comprises a first conductive component that is biased at a first DC voltage; a second conductive component that is biased at a second DC voltage that is opposite in polarity from the first DC voltage; a third conductive component; and a feedback component that generates an amplified version of a signal that has been generated by the third conductive component—the signal corresponding to a movement of the first conductive component, the second conductive component, and/or the third conductive component.

Further, the feedback component generates an inverted signal comprising an amplified inversion of the signal; and applies the inverted signal to respective capacitive coupling components that have been connected to the first conductive component and the second conductive component, in which an output of the system representing the movement comprises the amplified version of the signal and the inverted signal.

In yet another embodiment, the first conductive component is a first backplate, the second conductive component is a second backplate, and the third conductive component is a diaphragm comprising a flexible membrane. In another embodiment, the first conductive component is a first diaphragm comprising a first flexible membrane, the second conductive component is a second diaphragm comprising a second flexible membrane, and the third conductive component is a backplate.

In one embodiment, the system further comprises a first source component comprising a first resistive component and a first charge pump that applies, via the first resistive component, a first charge to the first conductive component to generate the first DC voltage; and a second source component comprising a second resistive component and a second charge pump that applies, via the second resistive component, a second charge to the second conductive component to generate the second DC voltage that is opposite in polarity from the first DC voltage.

In another embodiment, the first resistive component is connected to a first capacitor of the respective capacitive coupling components, and the second resistive component is connected to a second capacitor of the respective capacitive coupling components.

In yet another embodiment, the feedback component further comprises a third resistive component that is connected to a ground potential and the signal that has been generated by the third conductive component; an amplifier component that generates, via an operational amplifier, the amplified version of the signal; and an inverting component that generates, via an inverting amplifier, the inverted signal comprising the amplified inversion of signal.

In one embodiment, a method can comprise biasing, by a system (e.g., a MEMS microphone) comprising a feedback component, a pair of conductive components at voltages of opposite polarity, wherein the pair of conductive components comprises a first conductive component and a second conductive component; buffering, by the system, respective signals that have been capacitively coupled to the pair of conductive components to obtain buffered signals representing a movement of a third conductive component that is enclosed between the pair of conductive components; generating, by the system, a sum of the buffered signals and amplifying, by the system, the sum to obtain an amplified sum; and based on the amplified sum, applying, by the system, negative feedback to the third conductive component.

In another embodiment, the applying the negative feedback comprises inverting the amplified sum to obtain an inverted signal, and connecting the inverted signal to the third conductive component. In yet another embodiment, the method further comprises buffering, by the system, the inverted signal to obtain a buffered inversion, and based on the sum of the buffered signals and the buffered inversion, generating, by the system, an output representing the movement of the third conductive component.

As described above, conventional microphone technologies have had some drawbacks with respect to increasing an acoustic overload point of a differential microphone. On the other hand, various embodiments disclosed herein can enhance an acoustic overload point of a dual capacitor sensor device comprising two signal electrodes, e.g., dual backplates, dual diaphragms, etc. by biasing such electrodes at voltages of opposite polarity.

Figure 2:
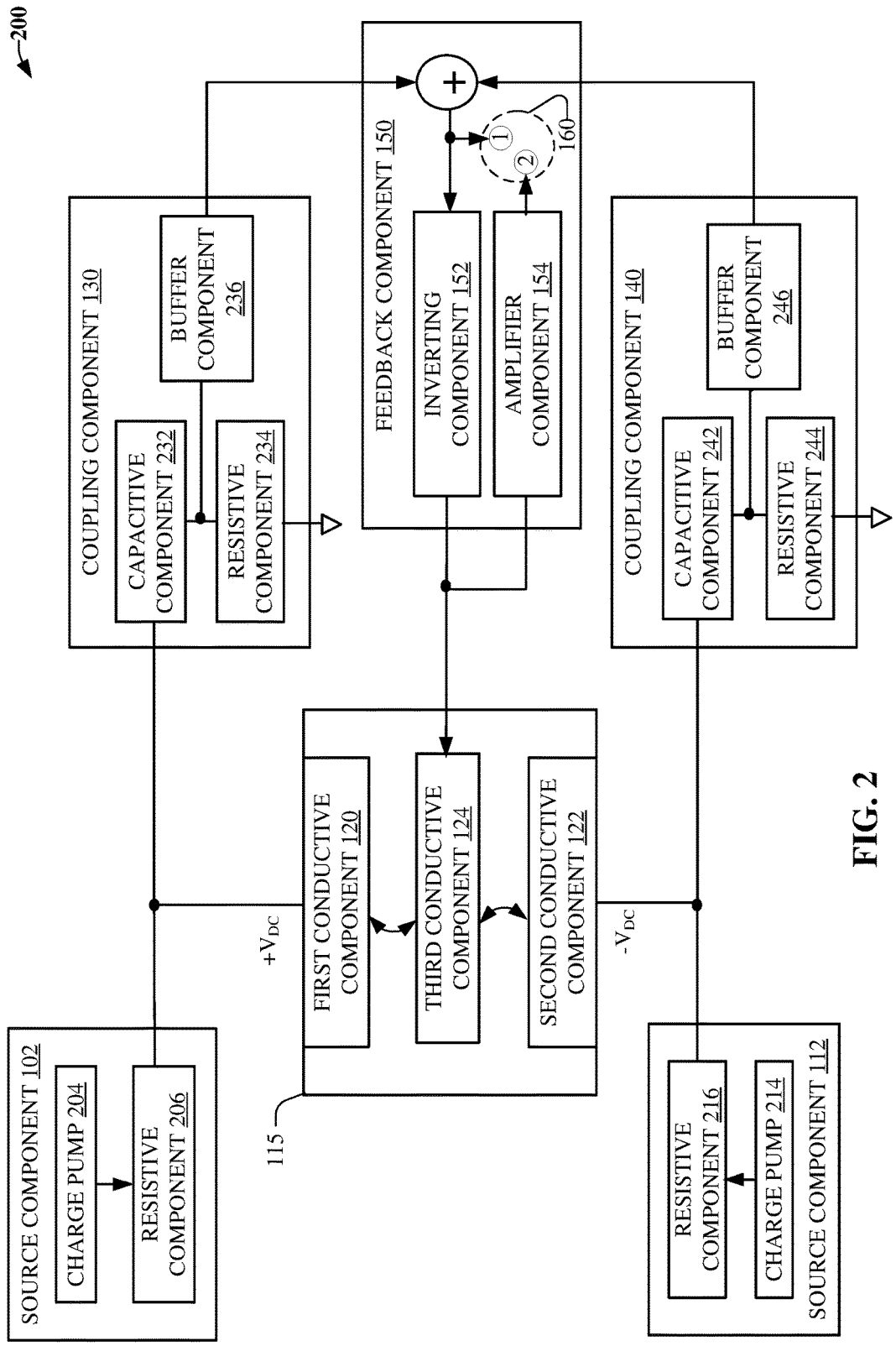
FIG. 2 illustrates another block diagram of negative feedback being applied to an inner conductive component of a dual capacitor sensor device, e.g., MEMS microphone, in accordance with various example embodiments.
Figure 3:
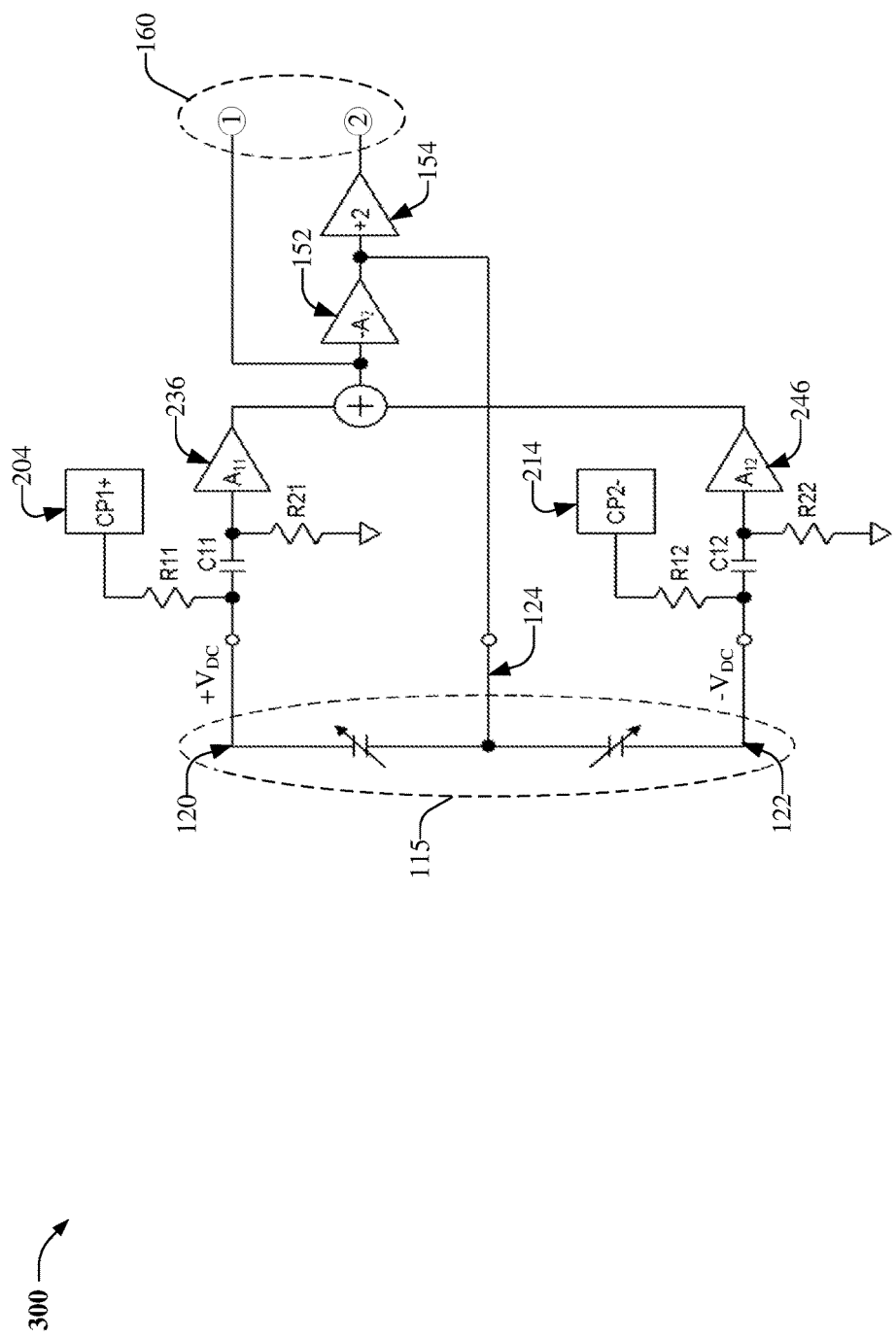
FIG. 3 illustrates a block diagram of a dual capacitor, e.g., microphone, circuit in which negative feedback is applied to an inner conductive component of a sensor, in accordance with various example embodiments.

In this regard, and now referring to FIGS. 1-3, block diagrams of negative feedback being applied to an inner conductive component of a dual capacitor sensor device (e.g., MEMS microphone) (100, 200), and a block diagram of a dual capacitor, e.g., microphone, circuit (300) in which negative feedback is applied to an inner conductive component of a sensor are illustrated, respectively, in accordance with various example embodiments.

As illustrated by FIGS. 1 and 2, first conductive component 120 of sensor 115, e.g., a capacitive based sensor, is biased, via source component 102, at a first DC voltage ($+V_{DC}$). Further, second conductive component 122 of sensor 115 is biased, via source component 112, at a second DC voltage ($-V_{DC}$) that is opposite in polarity from the first DC voltage. It should be appreciated that although first conductive component 120 is shown to be biased at a positive voltage and second conductive component 122 is shown to be biased at a negative voltage, such polarities can be reversed, e.g., first conductive component 120 can be biased at a negative voltage, while second conductive component 122 can be biased at a positive voltage.

In embodiment(s), first conductive component 120 is a first backplate, second conductive component 122 is a second backplate, and third conductive component 124 is a diaphragm comprising a flexible membrane. In other embodiment(s), first conductive component 120 is a first diaphragm comprising a first flexible membrane, second conductive component 122 is a second diaphragm comprising a second flexible membrane, and third conductive component 124 is a backplate.

In yet other embodiment(s), source component 102 can comprise charge pump 204 and resistive component 206. In this regard, source component 102 generates the first DC voltage by sourcing charge from charge pump 204 through resistive component 206, which can comprise one or more resistors, e.g., fabricated on a substrate, material, etc. of the dual capacitor sensor device. Further, source component 112 generates the second DC voltage by sourcing charge from charge pump 214 through resistive component 216, which can comprise one or more resistors, e.g., fabricated on the substrate, material, etc. of the dual capacitor sensor device.

In turn, first conductive component 120 can generate, based on a first capacitive coupling between first conductive component 120 and third conductive component 124, a first signal corresponding to a first movement of first conductive component 120 or third conductive component 124. Further, second conductive component 122 can generate, based on a second capacitive coupling between second conductive component 122 and third conductive component 124, a second signal corresponding to a second movement of second conductive component 122 or third conductive component 124.

It should be appreciated that in various embodiment(s), magnitudes of the first DC voltage and the second DC voltage can be equal, substantially equal (e.g., within 1%), etc. In other embodiment(s), the magnitudes of the first DC voltage and the second DC voltage can be different and can vary during operation of the dual capacitor sensor device, e.g., to account for production induced irregularities, e.g., corresponding to first conductive component 120, second conductive component 122, and/or third conductive component 124; to adjust a sensitivity of sensor 115 according to a magnitude of, e.g., acoustic, signals being applied to sensor 115, etc.

In this regard, in embodiment(s), charge pump 204 and charge pump 214 can be programable, e.g., via control system 402 described below, e.g., enabling dynamic adjustment of respective voltages biasing first conductive component 120 and second conductive component 122, e.g., without incurring switching transients, without temporarily muting an acoustic output during changes in magnitude of acoustic signals being applied to sensor 115, etc.

Feedback component 150 can generate a non-inverted output signal comprising a sum of buffered signals that have been generated by coupling component 130 and coupling component 140—the buffered signals corresponding to the first signal and the second signal. In this regard, coupling component 130 can comprise resistive component 234 and capacitive component 232 that decouples, via resistive component 234, first conductive component 120 from a ground potential to generate a first capacitively decoupled signal. Further, coupling component 130 can comprise buffer component 236 that buffers the first capacitively decoupled signal to generate a first buffered signal of the buffered signals.

Coupling component 140 can comprise resistive component 244 and capacitive component 242 that decouples, via resistive component 244, second conductive component 122 from the ground potential to generate a second capacitively decoupled signal. Further, coupling component 140 can comprise buffer component 246 that buffers the second capacitively decoupled signal to generate a second buffered signal of the buffered signals. In one embodiment, a first gain of buffer component 236 is equal to, or approximately equal to, a second gain of buffer component 246, e.g., within 1%.

Feedback component 150 further comprises inverting component 152 that can generate, via an inverting amplifier, an inverted output signal comprising an amplified inversion of the non-inverted output signal comprising the sum of the buffered signals. Further, feedback component 150 can comprise amplifier component 154 that can generate, via a non-inverting amplifier, an amplified version of the inverted output signal. In embodiment(s), a first gain of the inverting amplifier is greater than one, and a second gain of the non-inverting amplifier is equal to, or approximately equal to, two, e.g., within 1%.

In turn, feedback component 150 applies the inverted output signal to third conductive component 124, e.g., as negative feedback to enhance an acoustic overload point of the dual capacitor sensor device. In this regard, output 160 (e.g., a pseudo differential output) of the dual capacitor sensor device comprises the non-inverted output signal and an amplified version of the inverted output signal and represents the first movement and/or the second movement.

Referring now to FIG. 3, a block diagram of a dual capacitor, e.g., microphone, circuit (300) in which negative feedback is applied to an inner conductive component (124) (e.g., a center plate, diaphragm, etc.) of a sensor (115) is illustrated, in accordance with various example embodiments. The dual capacitor circuit comprises output signals corresponding to two conductive components (120 and 122), e.g., plates, backplates, diaphragms, etc. and a center conductive component (124), e.g., plate, diaphragm, etc. being positioned between the two conductive components. The two conductive components, e.g., outer plates, are biased from high voltage (e.g., greater that 10 volts) charge pumps CP1+ (204) and CP2− (214) that deliver bias voltages of opposite polarity (e.g., $+V_{DC}$ and $-V_{DC}$) to the two conductive outer components through resistances R11 and R12, respectively—such biasing enabling generation, via C11 and C12, of two output signals being input to input buffers $A_{11}$ (236) and $A_{12}$ (246) as common mode signals having the same polarity, i.e., they are not differential with respect to each other.

In this regard, the two output signals are passed to the input buffers $A_{11}$ and $A_{12}$ via capacitances C11 and C12, and input buffers $A_{11}$ and $A_{12}$ are biased to ground by resistances R21 and R22, respectively. Buffered signals from the outputs of $A_{11}$ and $A_{12}$ are summed, e.g., via discrete analog devices (not shown), to generate a summed output. In turn, the summed output is inverted and amplified by inverting amplifier A2 (152), e.g., having a gain greater than one, to generate an inverted summed output that is fed back to the center conductive component, e.g., to improve an acoustic overload point of the dual capacitor circuit.

The inverted summed output is also passed to buffer 154, e.g., a non-inverting amplifier (e.g., having a gain equal, or approximately equal (e.g., within 1%), to two) that generates an amplified version of the inverted summed output—output 160 comprising the summed output and the amplified version of the inverted summed output, e.g., forming a pseudo-differential output of the dual capacitor circuit.

Inherent benefits of embodiments of a dual capacitor sensor device disclosed herein are that such embodiments have superior linearity compared to a single capacitor sensor circuit, and have improved acoustic overload points compared to conventional differential sensor circuits, e.g., microphones. For example, with respect to a dual capacitor circuit of a microphone, non-linearity, e.g., represented by distortion, is typically caused by a combination of the effect of electrostatic force described by Coulomb's law and the existence of parasitic capacitances in parallel with active capacitance(s) of the microphone. In this regard, having a center conductive component (e.g., diaphragm, plate, backplate) that is placed between two outer conductive components (e.g., backplates, diaphragms) results in a force affecting the center conductive component to be symmetrical with an acoustic signal excursion around a zero-signal equilibrium, effectively cancelling out second order harmonics and other even-order harmonics of output distortion, e.g., potentially significantly improving linearity.

Other benefits of such embodiments comprise that conductive components of such embodiments can be biased by higher voltage(s); the center conductive component (e.g., diaphragm) can be more compliant with respect to not contacting the two outer conductive components (e.g., plates); a sensitivity of such embodiments can be increased because electrostatic force is applied to the center conductive component (e.g., diaphragm) from both sides of the center conductive component—effectively decreasing total electrostatic force being applied to the center conductive component and allowing for larger displacement of the center conductive component without it being pulled towards one of the two outer conductive components (e.g., backplates). In addition, the inverted output that is fed back to the center conductive component is not sensitive to a high capacitive load, and it is either close to ground or between ground and a power supply, power potential, etc., e.g., allowing for standard electro-static discharge (ESD) protection (not shown) to be applied at terminals, e.g., ASIC terminal(s) (not shown), corresponding to, being connected to, etc. the center conductive component.

Figure 4:
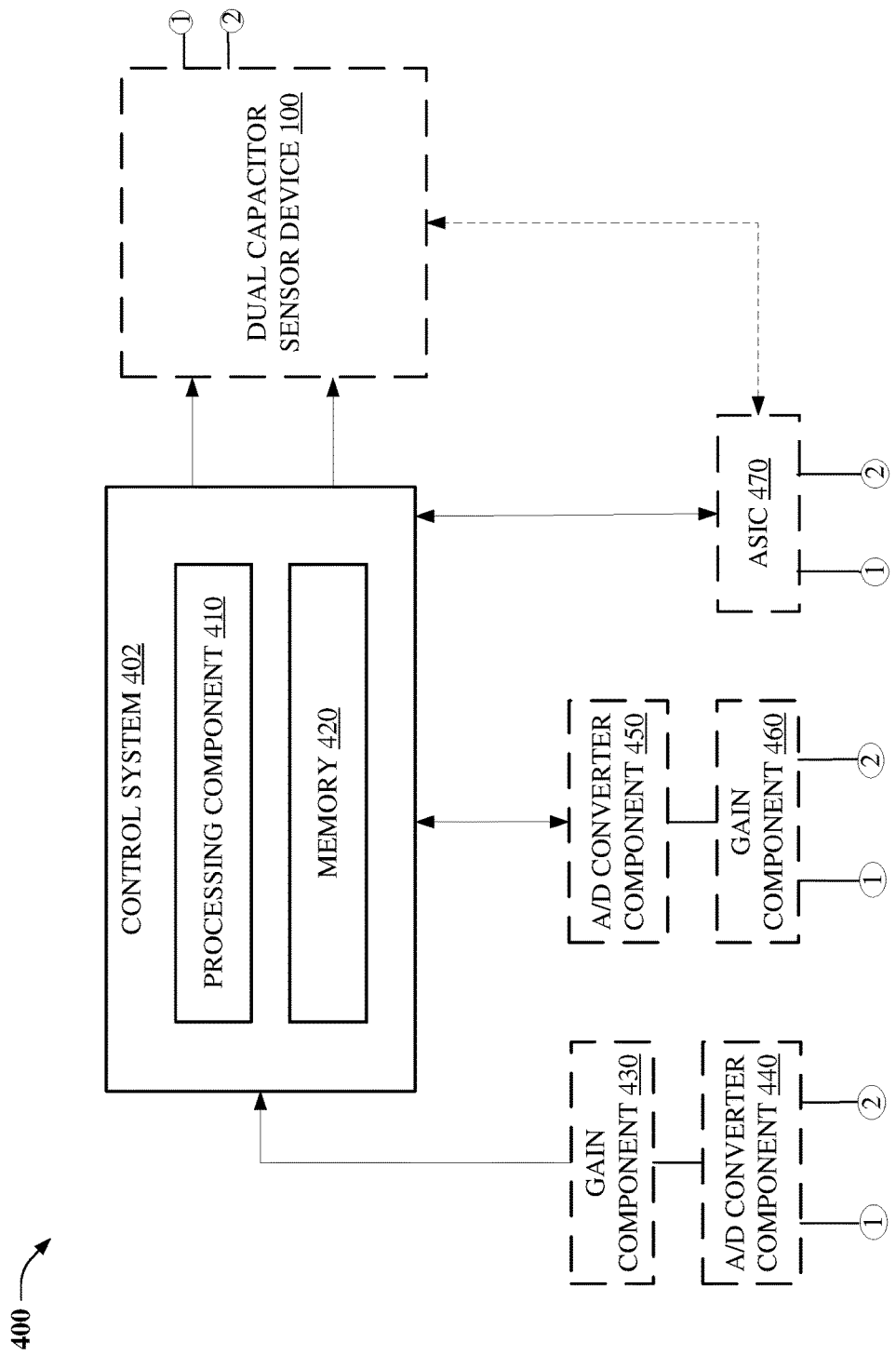
FIG. 4 illustrates a block diagram comprising a control system, a dual capacitor sensor device, various components, and an application specific integrated circuit (ASIC) that are configured to facilitate performance of various operations corresponding to the dual capacitor sensor device, in accordance with various example embodiments.

FIG. 4 illustrates a block diagram (400) comprising a control system (402), a dual capacitor sensor device (100) (e.g., MEMS microphone), various components (430, 440, 450, 460), and an ASIC (470) that are configured to facilitate performance of various operations corresponding to the dual capacitor sensor device, in accordance with various example embodiments. In this regard, in embodiment(s), output 160 (e.g., a pseudo differential analog output) of the dual capacitor sensor device can be communicatively coupled to analog-to-digital (A/D) converter component 440, which can convert output 160 to a digital signal. In turn, gain component 430, e.g., configured to digitally modify a gain of the digital signal, can increase/decrease such gain by a desired amount, and provide the gain-adjusted digital signal to other component(s), e.g., control system 402, for digital signal processing of, e.g., microphone based information, sound, etc.

In other embodiment(s), output 160 can be communicatively coupled to gain component 460, e.g., configured to modify, via analog device(s), discrete analog device(s), etc. a gain of the pseudo differential analog output. In turn, A/D converter component 450 can convert the gain-adjusted analog signal to a digital signal, and provide the gain-adjusted analog signal to other component(s), e.g., control system 402, for digital signal processing of, e.g., microphone based information, sound, etc.

It should be appreciated that in various embodiment(s), various component(s) (e.g., 430, 440, 450, 460) can be included in, e.g., a circuit, die, etc. of the dual capacitor sensor device. In other embodiment(s), the various component(s) can be included in an ASIC (470) that is communicatively coupled to various other component(s) (e.g., 102, 112, 115, 130, 140, 150) of the dual capacitor sensor device. In yet other embodiment(s), the ASIC can comprise the various other component(s), e.g., 102, 112, 115, 130, 140, 150, etc. Further, the ASIC can perform signal processing, e.g., filtering, etc. of the pseudo differential signal.

Figure 5:
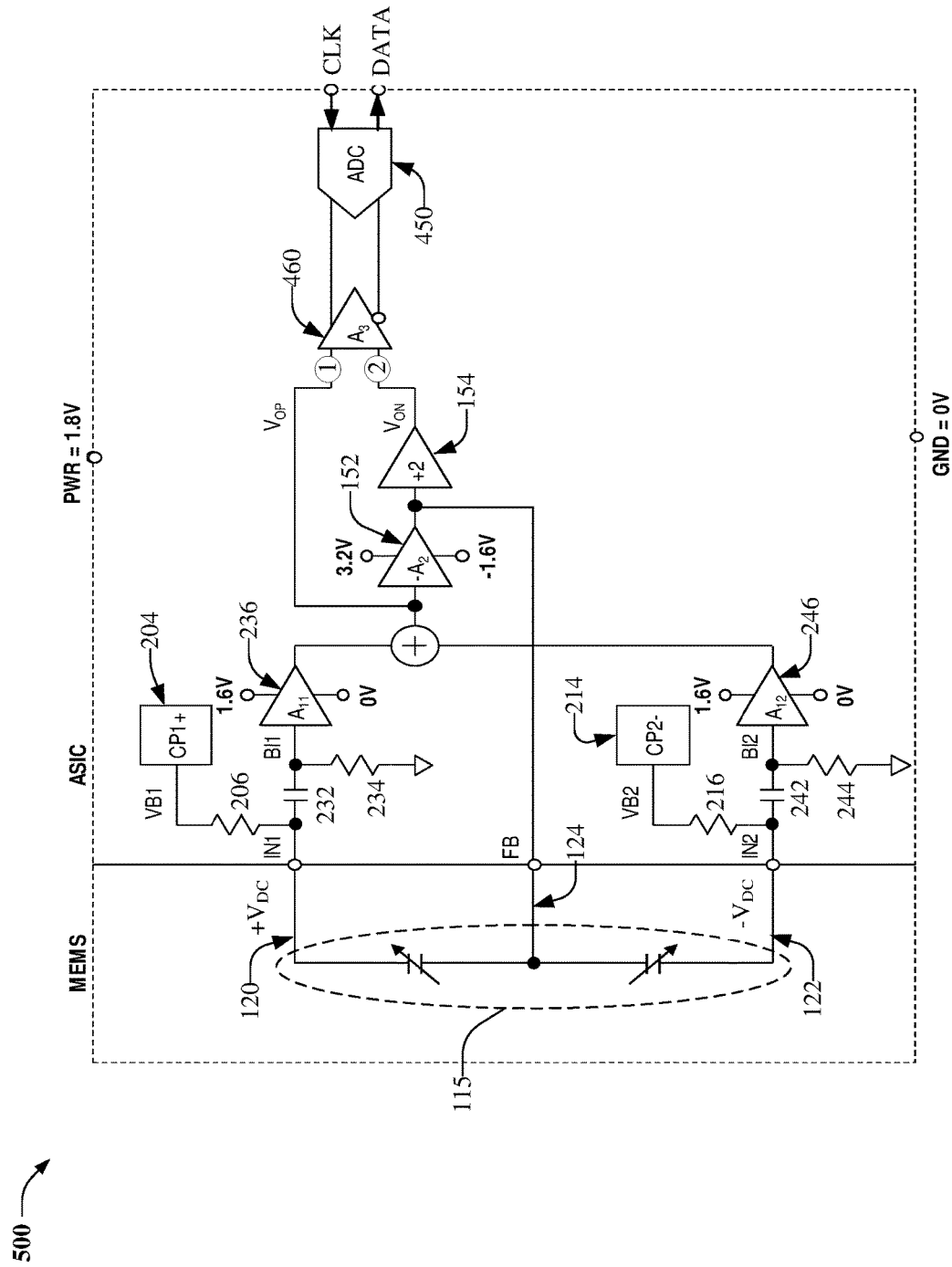
FIG. 5 illustrates a block diagram of a dual capacitor, e.g., microphone, circuit comprising an analog-to-digital converter (ADC) component, in accordance with various example embodiments.

Referring now to FIG. 5, a block diagram of a dual capacitor, e.g., microphone, circuit (500) comprising an A/D component ("ADC") (450) is illustrated, in accordance with various example embodiments. As illustrated by FIG. 5, CP1 is a positive voltage that is applied to, e.g., outer, conductive component 120 (e.g., backplate), and CP2 is a negative voltage that is applied to, e.g., outer, conductive component 122 (e.g., backplate). Further, conductive (e.g., inner conductive) component 124 (e.g., diaphragm) can be grounded, or (as illustrated by FIG. 5) can receive negative feedback (e.g., via 236 and 246) as input signals IN1 and IN2 that have the same polarity.

In embodiment(s), independent trimming of bias voltages (e.g., CP1, CP2) can be performed, e.g., during production, via control system 402, etc. to match sensitivities, e.g., of other bias voltage(s), component(s), device(s), etc.

In other embodiment(s), the following equations (equations (1)-(3)) pertain to FIG. 5:

$$V_0 = \qquad (1)$$

$$V_{OP} - V_{ON} = \frac{(1+2A_2)[A_{11}(V_{M1} - V_{NA11}) + A_{12}(V_{M2} + V_{NA12})] + A_2(2 - (A_{11} + A_{12}))V_{NA2}}{(1 + (A_{11} + A_{12})A_2)};$$

$$\approx V_{M1} + V_{M2} + V_{NA11} + V_{NA12}; \text{ and} \qquad (2)$$

$$A_{11} \approx A_{12} \approx 1. \qquad (3)$$

In this regard, $V_{NA11}$ and $V_{NA11}$ are uncorrelated noise sources, and noise $V_{NA2}$ is cancelled out by feedback for $A_{11}+A_{12}=2$. In yet other embodiment(s), CP1 and CP2 can be set independently; CP1 and CP2 can be adjusted during operation of the dual capacitor circuit, e.g., microphone; CP1 and CP2 can be adjusted one at a time; CP1 and CP2 can be adjusted during operation of the other, with marginal sensitivity shifts, e.g., because of a change of displacement of the center plate with respect to the backplates; CP1 and CP2 can be positive or negative; CP1 and CP2 can be of identical magnitude, e.g., within a defined amount of voltage difference; CP1 and CP2 can be differential signals with respect to the backplates, etc.

Figure 6:
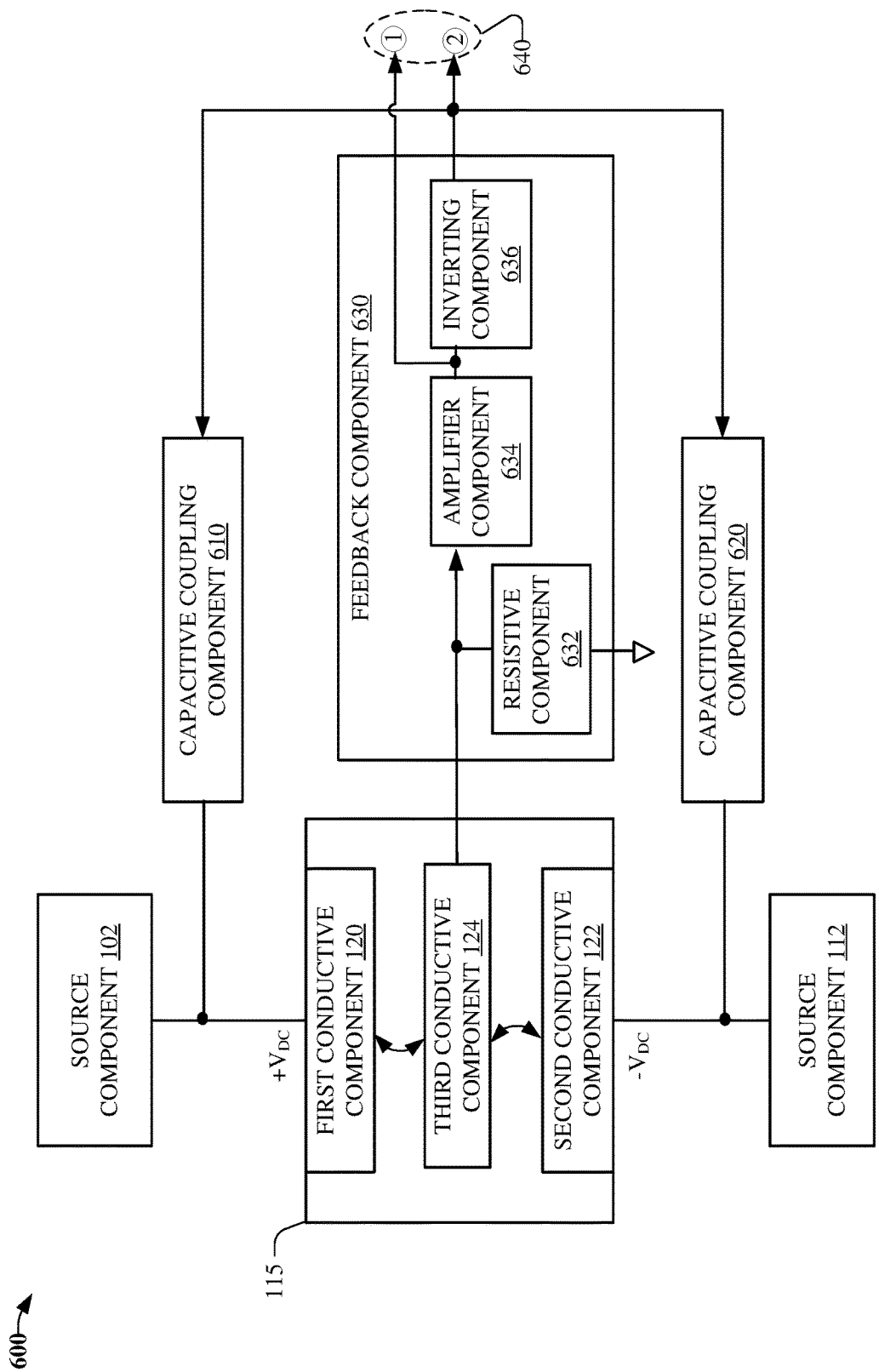
FIG. 6 illustrates a block diagram of negative feedback being capacitively coupled to outer conductive components of a dual capacitor sensor device, in accordance with various example embodiments.
Figure 7:
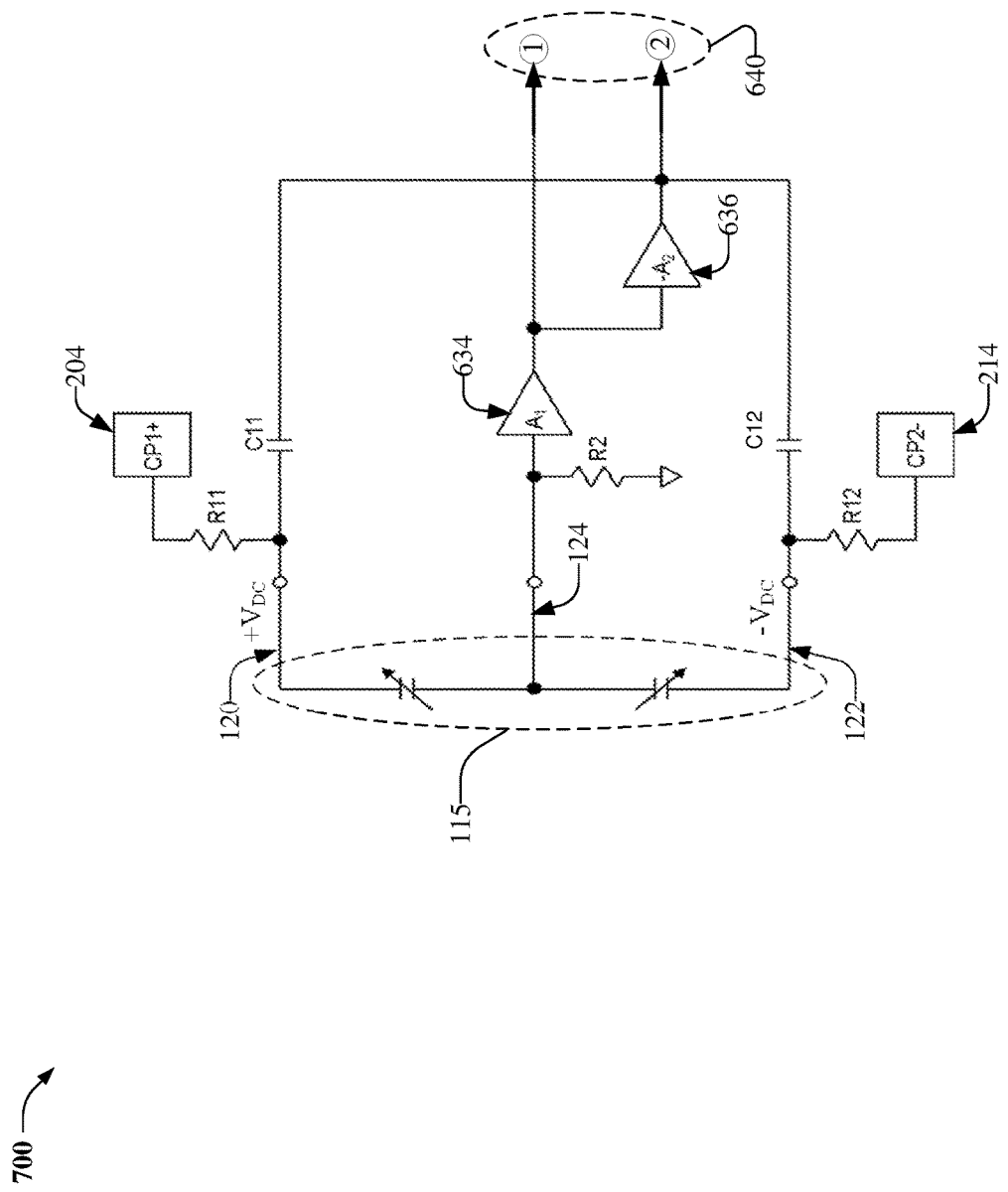
FIG. 7 illustrates a block diagram of a dual capacitor, e.g., microphone, circuit in which negative feedback is applied to outer conductive components of a sensor, in accordance with various example embodiments.

Now referring to FIGS. 6 and 7, block diagrams of negative feedback being capacitively coupled to outer conductive components of a dual capacitor sensor device (600), and a dual capacitor, e.g., microphone, circuit (700) in which negative feedback is applied to outer conductive components of a sensor are illustrated, respectively, in accordance with various example embodiments. As illustrated by FIG. 6, first conductive component 120 of sensor 115, e.g., a capacitive based sensor, is biased, via source component 102, at a first DC voltage ($+V_{DC}$). Further, second conductive component 122 of sensor 115 is biased, via source component 112, at a second DC voltage ($-V_{DC}$) that is opposite in polarity from the first DC voltage. It should be appreciated that although first conductive component 120 is shown to be biased at a positive voltage and second conductive component 122 is shown to be biased at a negative voltage, such polarities can be reversed, e.g., first conductive component 120 can be biased at a negative voltage, while second conductive component 122 can be biased at a positive voltage.

In embodiment(s), first conductive component 120 is a first backplate, second conductive component 122 is a second backplate, and third conductive component 124 is a diaphragm comprising a flexible membrane. In other embodiment(s), first conductive component 120 is a first diaphragm comprising a first flexible membrane, second conductive component 122 is a second diaphragm comprising a second flexible membrane, and third conductive component 124 is a backplate.

First conductive component 120 can generate, based on a first capacitive coupling between first conductive component 120 and third conductive component 124, a first signal corresponding to a first movement of first conductive component 120 or third conductive component 124. Further, second conductive component 122 can generate, based on a second capacitive coupling between second conductive component 122 and third conductive component 124, a second signal corresponding to a second movement of second conductive component 122 or third conductive component 124.

It should be appreciated that in various embodiment(s), magnitudes of the first DC voltage and the second DC voltage can be equal, substantially equal (e.g., within 1%), etc. In other embodiment(s), the magnitudes of the first DC voltage and the second DC voltage can be different and can vary during operation of the dual capacitor sensor device, e.g., to account for production induced irregularities, e.g., corresponding to first conductive component 120, second conductive component 122, and/or third conductive component 124; to adjust a sensitivity of sensor 115 according to a magnitude of, e.g., acoustic, signals being applied to sensor 115, etc.

Feedback component 630 comprises resistive component 632, amplifier component 634, and inverting component 636. In this regard, resistive component 632, e.g., comprising one or more resistors, e.g., fabricated on a substrate, die, material, etc. of the dual capacitor sensor device, couples a signal generated by third conductive component 124 to a ground potential—the signal corresponding to a movement of first conductive component 120, second conductive component 122, and/or third conductive component 124. Further, amplifier component 634 can generate, via a non-inverting amplifier, an output signal comprising an amplified version of the signal generated by third conductive component 124. Inverting component 636 can generate, via an inverting amplifier, an inverted output signal comprising an amplified inversion of the output signal, and feedback component 630 can apply, e.g., as negative feedback, the inverted output signal to respective capacitive coupling components (610 and 620) that have been connected to first conductive component 120 and second conductive component 122, e.g., to enhance an acoustic overload point of the dual capacitor sensor device. In embodiment(s), the respective capacitive coupling components can comprise one or more capacitors, e.g., fabricated on the substrate, die, material, etc. of the dual capacitor sensor device. Further, pseudo differential output 640 of the dual capacitor sensor device comprises the output signal and the inverted output signal, and represents the movement of first conductive component 120, second conductive component 122, and/or third conductive component 124.

Referring now to FIG. 7, a block diagram of a dual capacitor, e.g., microphone, circuit (700) in which negative feedback is applied to outer conductive components of a sensor is illustrated, in accordance with various example embodiments. As illustrated by FIG. 7, first conductive component 120 of sensor 115, e.g., a capacitive based sensor, is biased, by charge pump 204 via resistor R11, at a first DC voltage ($+V_{DC}$). Further, second conductive component 122 of sensor 115 is biased, by charge pump 214 via resistor R12, at a second DC voltage ($-V_{DC}$) that is opposite in polarity from the first DC voltage. It should be appreciated that although first conductive component 120 is shown to be biased at a positive voltage and second conductive component 122 is shown to be biased at a negative voltage, such polarities can be reversed, e.g., first conductive component 120 can be biased at a negative voltage, while second conductive component 122 can be biased at a positive voltage.

In embodiment(s), first conductive component 120 is a first backplate, second conductive component 122 is a second backplate, and third conductive component 124 is a diaphragm comprising a flexible membrane. In other embodiment(s), first conductive component 120 is a first diaphragm comprising a first flexible membrane, second conductive component 122 is a second diaphragm comprising a second flexible membrane, and third conductive component 124 is a backplate.

First conductive component 120 can generate, based on a first capacitive coupling between first conductive component 120 and third conductive component 124, a first signal corresponding to a first movement of first conductive component 120 or third conductive component 124. Further, second conductive component 122 can generate, based on a second capacitive coupling between second conductive component 122 and third conductive component 124, a second signal corresponding to a second movement of second conductive component 122 or third conductive component 124.

It should be appreciated that in various embodiment(s), magnitudes of the first DC voltage and the second DC voltage can be equal, substantially equal (e.g., within 1%), etc. In other embodiment(s), the magnitudes of the first DC voltage and the second DC voltage can be different and can vary during operation of the dual capacitor sensor device, e.g., to account for production induced irregularities, e.g., corresponding to first conductive component 120, second conductive component 122, and/or third conductive component 124; to adjust a sensitivity of sensor 115 according to a magnitude of, e.g., acoustic, signals being applied to sensor 115, etc.

Resistor R2, e.g., fabricated on a substrate, die, material, etc. of the dual capacitor sensor device, couples the signal generated by third conductive component 124 to a ground potential. Further, amplifier component 634 amplifies the signal to generate an amplified output. Inverting component 636 generates an inverted amplified output signal comprising an amplified inversion of the amplified output, which is fed, via coupling capacitors C11 and C12, back to conductive components 120 and 122, respectively, e.g., to maintain a combination of enhanced linearity and an enhanced acoustic overload point.

Figure 8:
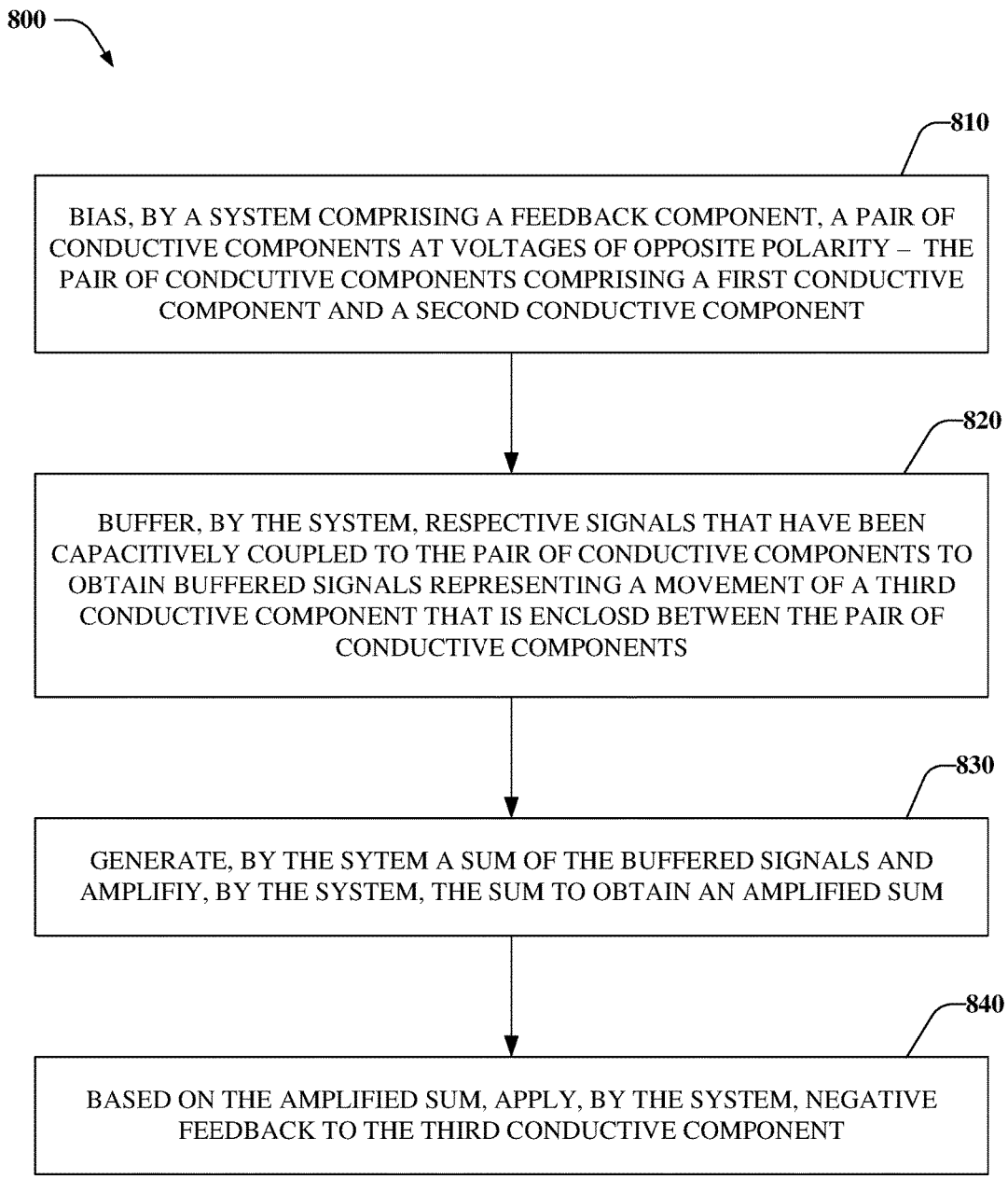
FIGS. 8 and 9 illustrate flowcharts of method(s) associated with applying negative feedback to an inner conductive component of a dual capacitor sensor device, e.g., MEMS microphone, in accordance with various example embodiments.
Figure 9:
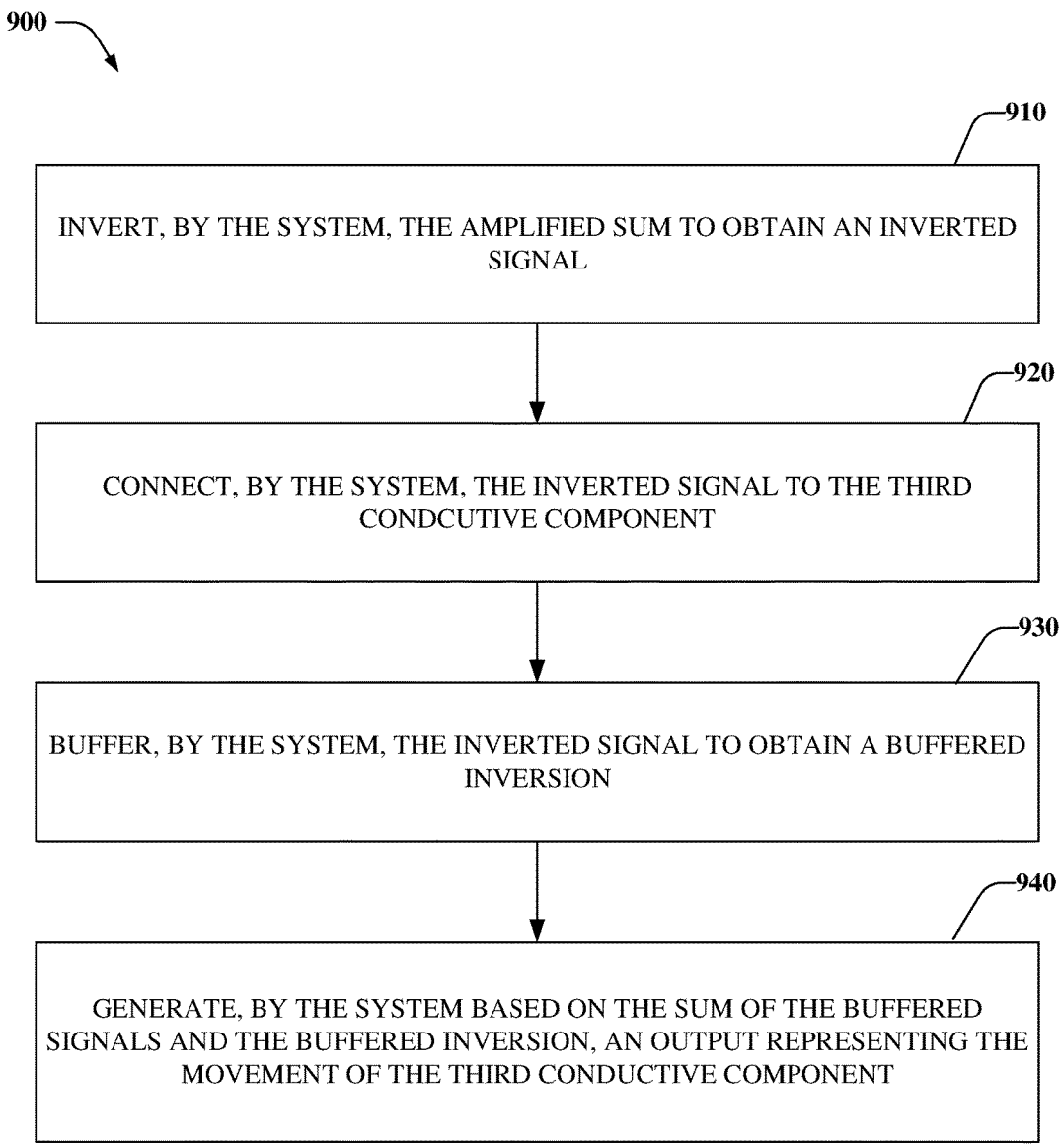
Figure 10:
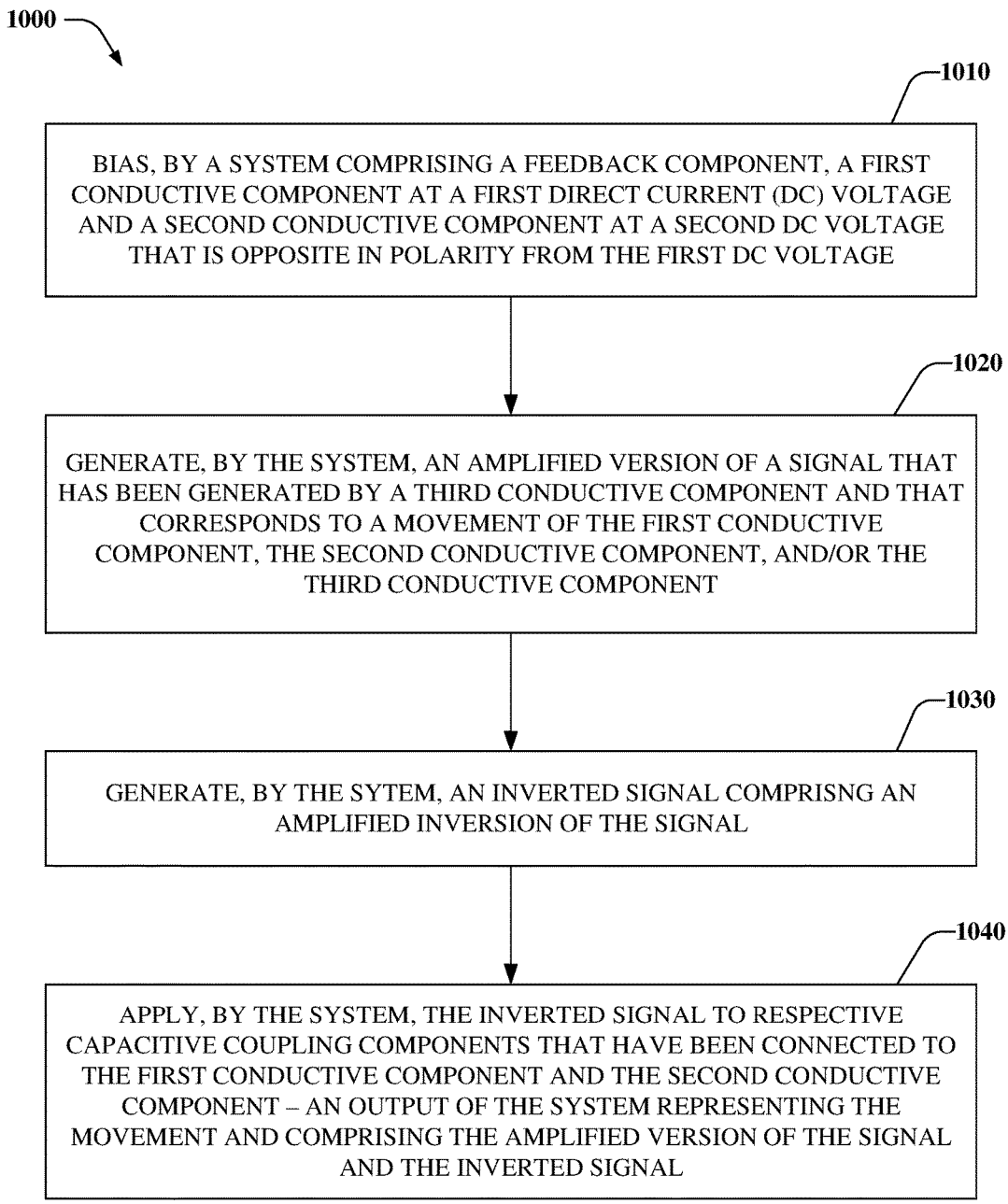
FIG. 10 illustrates a flow chart of a method associated with negative feedback being capacitively coupled to outer conductive components of a dual capacitor sensor device, e.g., MEMS microphone, in accordance with various example embodiments.

FIGS. 8-10 illustrate methodologies in accordance with the disclosed subject matter. For simplicity of explanation, the methodologies are depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events.

Referring now to FIGS. 8 and 9, flowcharts (800 and 900) of method(s) associated with applying negative feedback to an inner conductive component of a dual capacitor sensor device, e.g., MEMS microphone, are illustrated, in accordance with various example embodiments. At 810, a system (e.g., 100, 200, 300, 400, 500) comprising a feedback component (150) can bias a pair of conductive components at voltages of opposite polarity—the pair of conductive components comprising a first conductive component and a second conductive component. At 820, the system can buffer respective signals that have been capacitively coupled to the pair of conductive components to obtain buffered signals representing a movement of a third conductive component that is enclosed between the pair of conductive components. At 830, the system can generate a sum of the buffered signals and amplify the sum to obtain an amplified sum. At 840, the system can apply, based on the amplified sum, negative feedback to the third conductive component.

With respect to an application of the negative feedback, and referring now to embodiment(s) illustrated by FIG. 9, at 910, the system can invert the amplified sum to obtain an inverted signal. At 920, the system can connect the inverted signal to the third conductive component. At 930, the system can buffer the inverted signal to obtain a buffered inversion. At 940, the system can generate, based on the sum of the buffered signals and the buffered inversion, an output, e.g., pseudo differential output, representing the movement of the third conductive component.

FIG. 10 illustrates a flow chart (1000) of a method associated with negative feedback being capacitively coupled to outer conductive components of a dual capacitor sensor device, e.g., MEMS microphone, in accordance with various example embodiments. At 1010, a system (e.g., 600, 700) comprising a feedback component (630) can bias a first conductive component at a first DC voltage and a second conductive component at a second DC voltage that is opposite in polarity from the first DC voltage. At 1020, the system can generate an amplified version of a signal that has been generated by the third conductive component and that corresponds to a movement of the first conductive component, the second conductive component, and/or the third conductive component. At 1030, the system can generate an inverted signal comprising an amplified inversion of the signal. At 1040, the system can apply the inverted signal to respective capacitive coupling components that have been connected to the first conductive component and the second conductive component—an output, e.g., pseudo differential output, of the system representing the movement and comprising the amplified version of the signal and the inverted signal.

As it employed in the subject specification, the term "component" refers to substantially any analog and/or digital based device(s), circuit(s), etc. comprising, e.g., a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein. Further, the term "processing component" can refer to substantially any computing processing unit or device, e.g., processing component 410, comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

In the subject specification, the term "memory" and substantially any other information storage component relevant to operation and functionality of control system 402, processing component 410, and/or devices disclosed herein refer to "memory components," or entities embodied in a "memory," or components comprising the memory. It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the components and/or devices disclosed herein can comprise, without being limited to comprising, these and any other suitable types of memory.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of dual capacitor devices, apparatus, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A system, comprising:
   a first conductive component that is biased at a first direct current (DC) voltage;
   a second conductive component that is biased at a second DC voltage that is opposite in polarity to the first DC voltage;
   a third conductive component, wherein the first conductive component generates, based on a first capacitive coupling between the first conductive component and the third conductive component, a first signal corresponding to a first movement of the first conductive component or the third conductive component, and wherein the second conductive component generates, based on a second capacitive coupling between the second conductive component and the third conductive component, a second signal corresponding to a second movement of the second conductive component or the third conductive component; and
   a feedback component that
      generates a non-inverted output signal comprising a sum of buffered signals that have been generated by respective coupling components corresponding to the first signal and the second signal,
      generates an inverted output signal comprising an amplified inversion of the non-inverted output signal, and
      applies the inverted output signal to the third conductive component, wherein an output of the system representing at least one of the first movement or the second movement comprises the non-inverted output signal and an amplified version of the inverted output signal.

2. The system of claim 1, wherein the first conductive component is a first backplate, wherein the second conductive component is a second backplate, and wherein the third conductive component is a diaphragm comprising a flexible membrane.

3. The system of claim 1, wherein the first conductive component is a first diaphragm comprising a first flexible membrane, wherein the second conductive component is a second diaphragm comprising a second flexible membrane, and wherein the third conductive component is a backplate.

4. The system of claim 1, further comprising:
   a first source component comprising
      a first resistive component, and
      a first charge pump that applies, via the first resistive component, a first charge to the first conductive component to generate the first DC voltage; and
   a second source component comprising
      a second resistive component, and
      a second charge pump that applies, via the second resistive component, a second charge to the second conductive component to generate the second DC voltage that is opposite in polarity from the first DC voltage.

5. The system of claim 1, wherein a first coupling component of the respective coupling components comprises a first resistive component and a first capacitive component that decouples, via the first resistive component, the first conductive component from a ground potential to generate a first capacitively decoupled signal, and wherein a second coupling component of the respective coupling components comprises a second resistive component and a second capacitive component that decouples, via the second resistive component, the second conductive component from the ground potential to generate a second capacitively decoupled signal.

6. The system of claim 5, wherein the first coupling component further comprises a first buffer component that buffers the first capacitively decoupled signal to generate a first buffered signal of the buffered signals, and wherein the second coupling component further comprises a second buffer component that buffers the second capacitively decoupled signal to generate a second buffered signal of the buffered signals.

7. The system of claim 6, wherein a first gain of the first buffer component is equal to or approximately equal to a second gain of the second buffer component.

8. The system of claim 1, wherein the feedback component comprises:
an inverting component that generates, via an inverting amplifier, the inverted output signal comprising the amplified inversion of the non-inverted output signal.

9. The system of claim 8, wherein the feedback component comprises:
an amplifier component configured to generate, via a non-inverting amplifier, the amplified version of the inverted output signal.

10. The system of claim 9, wherein a first gain of the inverting amplifier is greater than one.

11. The system of claim 10, wherein a second gain of the non-inverting amplifier is equal to or approximately equal to two.

12. A system, comprising:
a first conductive component that is biased at a first direct current (DC) voltage;
a second conductive component that is biased at a second DC voltage that is opposite in polarity from the first DC voltage;
a third conductive component; and
a feedback component that:
generates an amplified version of a signal that has been generated by the third conductive component, wherein the signal corresponds to a movement of at least one of the first conductive component, the second conductive component, or the third conductive component;
generates an inverted signal comprising an amplified inversion of the signal; and
applies the inverted signal to respective capacitive coupling components that have been connected to the first conductive component and the second conductive component, wherein an output of the system representing the movement comprises the amplified version of the signal and the inverted signal.

13. The system of claim 12, wherein the first conductive component is a first backplate, wherein the second conductive component is a second backplate, and wherein the third conductive component is a diaphragm comprising a flexible membrane.

14. The system of claim 12, wherein the first conductive component is a first diaphragm comprising a first flexible membrane, wherein the second conductive component is a second diaphragm comprising a second flexible membrane, and wherein the third conductive component is a backplate.

15. The system of claim 12, further comprising:
a first source component comprising
a first resistive component, and
a first charge pump that applies, via the first resistive component, a first charge to the first conductive component to generate the first DC voltage; and
a second source component comprising
a second resistive component, and
a second charge pump that applies, via the second resistive component, a second charge to the second conductive component to generate the second DC voltage that is opposite in polarity from the first DC voltage.

16. The system of claim 15, wherein the first resistive component is connected to a first capacitor of the respective capacitive coupling components, and wherein the second resistive component is connected to a second capacitor of the respective capacitive coupling components.

17. The system of claim 15, wherein the feedback component comprises:
a third resistive component that is connected to a ground potential and the signal that has been generated by the third conductive component;
an amplifier component that generates, via an operational amplifier, the amplified version of the signal; and
an inverting component that generates, via an inverting amplifier, the inverted signal comprising the amplified inversion of signal.

18. A method, comprising:
biasing, by a system comprising a feedback component, a pair of conductive components at voltages of opposite polarity, wherein the pair of conductive components comprises a first conductive component and a second conductive component;
buffering, by the system, respective signals that have been capacitively coupled to the pair of conductive components to obtain buffered signals representing a movement of a third conductive component that is enclosed between the pair of conductive components;
generating, by the system, a sum of the buffered signals and amplifying, by the system, the sum to obtain an amplified sum; and
based on the amplified sum, applying, by the system, negative feedback to the third conductive component.

19. The method of claim 18, wherein the applying the negative feedback comprises:
inverting the amplified sum to obtain an inverted signal; and
connecting the inverted signal to the third conductive component.

20. The method of claim 19, further comprising:
buffering, by the system, the inverted signal to obtain a buffered inversion; and
based on the sum of the buffered signals and the buffered inversion, generating, by the system, an output representing the movement of the third conductive component.

* * * * *